US012677645B2

(12) United States Patent
Lee et al.

(10) Patent No.: US 12,677,645 B2
(45) Date of Patent: Jul. 7, 2026

(54) SEMICONDUCTOR PACKAGE AND METHOD OF FABRICATING THE SAME

(71) Applicant: SAMSUNG ELECTRONICS CO., LTD., Suwon-si (KR)

(72) Inventors: Jihyun Lee, Suwon-si (KR); Junho Lee, Suwon-si (KR); Kang Joon Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 390 days.

(21) Appl. No.: 18/226,372

(22) Filed: Jul. 26, 2023

(65) Prior Publication Data

US 2024/0145295 A1 May 2, 2024

(30) Foreign Application Priority Data

Oct. 27, 2022 (KR) ......................... 10-2022-0140586

(51) Int. Cl.
*H10W 20/00* (2026.01)
*H10W 20/44* (2026.01)
(Continued)

(52) U.S. Cl.
CPC ....... *H10W 20/01* (2026.01); *H10W 20/4403* (2026.01); *H10W 74/016* (2026.01); (Continued)

(58) Field of Classification Search
CPC ................. H01L 21/768; H01L 21/565; H01L 23/49816; H01L 23/53209; H01L 23/12; H01L 23/3128; H01L 24/48; H01L 24/16;

H01L 24/81; H01L 24/15; H10W 20/01; H10W 20/4403; H10W 74/016; H10W 90/00; H10W 90/701; H10W 90/751; H10W 72/072; H10W 72/20; H10W 72/50; H10W 72/90; H10W 72/07252; H10W 72/07253; H10W 72/221; H10W 70/60; H10W 70/614
See application file for complete search history.

(56) References Cited

U.S. PATENT DOCUMENTS 7,276,801 B2 10/2007 Dubin et al.
7,485,564 B2 2/2009 Daubenspeck et al.
(Continued)

FOREIGN PATENT DOCUMENTS

KR 10-1111426 B1 2/2012

*Primary Examiner* — Steven B Gauthier
*Assistant Examiner* — Marc-Anthony Armand
(74) *Attorney, Agent, or Firm* — Muir Patent Law, PLLC

(57) ABSTRACT

A semiconductor package includes a first structure that includes an upper connection pattern; a second structure that includes a lower connection pattern; and a connection structure that connects the upper connection pattern of the first structure to the lower connection pattern of the second structure, wherein the connection structure includes a lower conductor connected to the upper connection pattern of the first structure; an upper conductor connected to the lower conductor and the lower connection pattern of the second structure; and a dielectric pattern that at least partially surrounds the upper conductor, and the dielectric pattern includes a first surface in contact with the upper conductor; and a second surface in contact with the lower conductor.

20 Claims, 9 Drawing Sheets

(51) Int. Cl.
_H10W 74/01_ (2026.01)
_H10W 90/00_ (2026.01)

(52) U.S. Cl.
CPC ......... _H10W 90/00_ (2026.01); _H10W 90/701_
(2026.01); _H10W 90/751_ (2026.01)

(56) References Cited

U.S. PATENT DOCUMENTS

| | | | |
|---|---|---|---|
| 8,294,279 B2 * | 10/2012 | Chen ....................... | H01L 24/05 |
| | | | 257/737 |
| 8,937,256 B2 | 1/2015 | Inoue et al. | |
| 9,018,758 B2 | 4/2015 | Hwang et al. | |
| 9,412,712 B2 | 8/2016 | Jang et al. | |
| 9,613,921 B2 | 4/2017 | Daubenspeck et al. | |
| 10,083,939 B2 | 9/2018 | Seo et al. | |
| 2021/0104483 A1 * | 4/2021 | Park ........................ | H01L 24/92 |
| 2021/0118803 A1 * | 4/2021 | Park ................... | H10W 70/611 |
| 2022/0077100 A1 | 3/2022 | Chu et al. | |
| 2022/0093549 A1 | 3/2022 | Chu et al. | |
| 2023/0063251 A1 * | 3/2023 | Liao ........................ | H10P 72/74 |

* cited by examiner

SEMICONDUCTOR PACKAGE AND METHOD OF FABRICATING THE SAME

CROSS-REFERENCE TO RELATED APPLICATION

This U.S. nonprovisional application claims priority under 35 U.S.C. § 119 to Korean Patent Application No. 10-2022-0140586 filed on Oct. 27, 2022, in the Korean Intellectual Property Office, the disclosure of which is hereby incorporated by reference in their entirety.

BACKGROUND

1. Field

Embodiments relate to a semiconductor package and a method of fabricating the same.

2. Description of the Related Art

A semiconductor package may be provided to implement an integrated circuit chip to qualify for use in electronic products. A semiconductor package may be configured such that a semiconductor chip is mounted on a printed circuit board (PCB) and bonding wires or bumps may be used to electrically connect the semiconductor chip to the printed circuit board. With the development of electronic industry, various studies have been conducted to help improve reliability and durability of semiconductor packages.

SUMMARY

The embodiments may be realized by providing a semiconductor package including a first structure that includes an upper connection pattern; a second structure that includes a lower connection pattern; and a connection structure that connects the upper connection pattern of the first structure to the lower connection pattern of the second structure, wherein the connection structure includes a lower conductor connected to the upper connection pattern of the first structure; an upper conductor connected to the lower conductor and the lower connection pattern of the second structure; and a dielectric pattern that at least partially surrounds the upper conductor, and the dielectric pattern includes a first surface in contact with the upper conductor; and a second surface in contact with the lower conductor.

The embodiments may be realized by providing a semiconductor package including a connection structure including a lower conductor, an upper conductor connected to the lower conductor, and a dielectric pattern that at least partially surrounds the upper conductor; a first structure including an upper connection pattern connected to the lower conductor and an upper dielectric layer that surrounds the lower conductor; and a second structure including a lower connection pattern connected to the upper conductor and a lower dielectric layer that surrounds the upper conductor, wherein the dielectric pattern is in contact with a bottom surface of the lower dielectric layer of the second structure.

The embodiments may be realized by providing a semiconductor package including a first structure including an upper connection pattern and an upper dielectric layer; a second structure including a lower connection pattern and a lower dielectric layer that faces the upper dielectric layer of the first structure; a connection structure that connects the upper connection pattern of the first structure to the lower connection pattern of the second structure; and a molding layer that surrounds the connection structure and the second structure, wherein: the connection structure includes a lower conductor connected to the upper connection pattern of the first structure; an upper conductor connected to the lower conductor and the lower connection pattern of the second structure; and a dielectric pattern that at least partially surrounds the upper conductor and contacts a bottom surface of the lower dielectric layer, the dielectric pattern includes a first surface in contact with the upper conductor; a second surface in contact with the lower conductor; and a third surface in contact with the molding layer, and the first surface and the third surface of the dielectric pattern are curved.

The embodiments may be realized by providing a method of fabricating a semiconductor package, the method including forming a first structure that includes a lower connection pattern; forming a preliminary upper conductor connected to the lower connection pattern of the first structure; forming a preliminary dielectric layer that covers the preliminary upper conductor; removing a lower portion of the preliminary dielectric layer to expose a lower portion of the preliminary upper conductor; forming a second structure that includes an upper connection pattern; forming a preliminary lower conductor connected to the upper connection pattern of the second structure; and connecting the preliminary upper conductor to the preliminary lower conductor.

BRIEF DESCRIPTION OF THE DRAWINGS

Features will be apparent to those of skill in the art by describing in detail exemplary embodiments with reference to the attached drawings in which.

DETAILED DESCRIPTION

The following will describe in detail a semiconductor package and its fabrication method according to some embodiments in conjunction with the accompanying drawings.

Figure 1A:
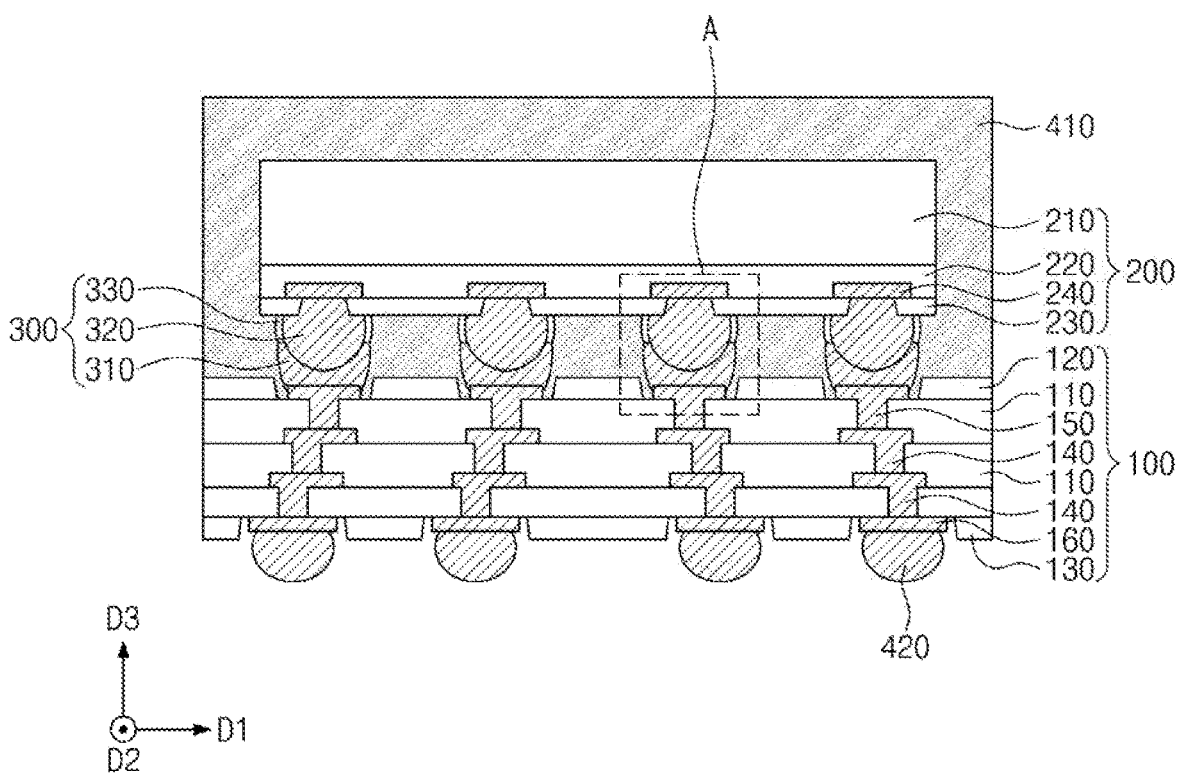
FIG. 1A illustrates a cross-sectional view showing a semiconductor package according to some embodiments.
Figure 1B:
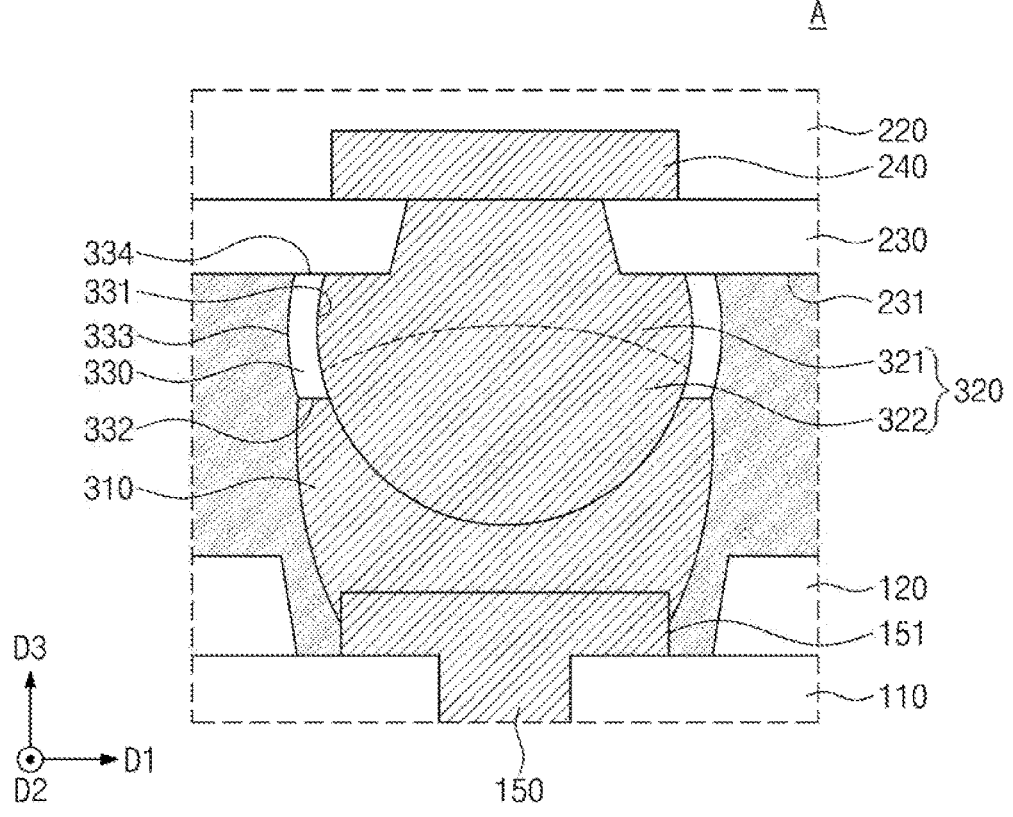
FIG. 1B illustrates an enlarged view showing section A of FIG. 1A.

FIG. 1A illustrates a cross-sectional view showing a semiconductor package according to some embodiments. FIG. 1B illustrates an enlarged view showing section A of FIG. 1A.

Referring to FIG. 1A, a semiconductor package may include a first structure 100, a second structure 200, connection structures 300, a molding layer 410, and terminals 420. As used herein, the terms "first," "second," and the like are merely for identification and differentiation, and are not intended to imply or require sequential inclusion (e.g., a third element and a fourth element may be described without implying or requiring the presence of a first element or second element).

The first structure 100 may include inner dielectric layers 110, an upper dielectric layer 120, a first lower dielectric layer 130, inner patterns 140, upper connection patterns 150, and first lower connection patterns 160.

The inner dielectric layers 110 may be between the upper dielectric layer 120 and the first lower dielectric layer 130. The upper dielectric layer 120 may be a dielectric layer at top of the first structure 100. The first lower dielectric layer 130 may be a dielectric layer at bottom of the first structure 100.

The inner dielectric layers 110, the upper dielectric layer 120, and the first lower dielectric layer 130 may each have a plate shape that expands along or is in a plane of a first direction D1 and a second direction D2. The first direction D1 and the second direction D2 may intersect each other. In an implementation, the first direction D1 and the second direction D2 may be horizontal directions that are orthogonal to each other. The first lower dielectric layer 130, the inner dielectric layers 110, and the upper dielectric layer 120 may be sequentially stacked along a third direction D3. The third direction D3 may intersect the first direction D1 and the second direction D2. In an implementation, the third direction D3 may be a vertical direction perpendicular to the first direction D1 and the second direction D2.

The inner dielectric layers 110, the upper dielectric layer 120, and the first lower dielectric layer 130 may include an organic material, e.g., a photo-imageable dielectric (PID) material. The photo-imageable dielectric material may include, e.g., photosensitive polyimide, polybenzoxazole, a phenolic polymer, or a benzocyclobutene polymer. As used herein, the term "or" is not an exclusive term, e.g., "A or B" would include A, B, or A and B.

The inner patterns 140 may be conductive patterns within the first structure 100. The inner patterns 140 may be surrounded by the inner dielectric layers 110. The inner patterns 140 may be in the inner dielectric layers 110. The inner pattern 140 may include a via portion for vertical connection and a wiring portion for horizontal connection. The inner patterns 140 may include a conductive material.

The upper connection patterns 150 may be conductive patterns that are exposed upwardly from (e.g., at a top of) the first structure 100. The upper connection patterns 150 may be exposed through the upper dielectric layer 120. The upper connection pattern 150 may include a via portion for vertical connection and a wiring portion for horizontal connection. The wiring portion of the upper connection pattern 150 may be surrounded by the upper dielectric layer 120. The upper connection pattern 150 may be connected to the inner pattern 140. The upper connection pattern 150 may include a conductive material.

The first lower connection patterns 160 may be conductive patterns that are exposed downwardly from (e.g., at a bottom of) the first structure 100. The first lower connection patterns 160 may be exposed through the first lower dielectric layer 130. The first lower connection pattern 160 may be surrounded by the first lower dielectric layer 130. The first lower connection pattern 160 may be connected to the inner pattern 140. The first lower connection pattern 160 may be electrically connected through the inner patterns 140 to the upper connection pattern 150. The first lower connection pattern 160 may include a conductive material.

The first structure 100 may be a redistribution substrate including redistribution patterns. In an implementation, the first structure 100 may be a printed circuit board or a semiconductor chip.

The second structure 200 may include a substrate 210, a wiring structure 220, a second lower dielectric layer 230, and second lower connection patterns 240.

The substrate 210 may be a semiconductor substrate. In an implementation, the substrate 210 may include silicon (Si), germanium (Ge), silicon-germanium (SiGe), gallium phosphide (GaP), or gallium arsenide (GaAs). In an implementation, the substrate 210 may be a silicon-on-insulator (SOI) substrate or a germanium-on-insulator (GOI) substrate.

The wiring structure 220 may be on the substrate 210. The wiring structure 220 may include a conductive structure and a dielectric layer that surrounds the conductive structure. The conductive structure of the wiring structure 220 may include, e.g., a conductive contact, a conductive line, or a conductive pad. The conductive structure of the wiring structure 220 may be electrically connected to the second lower connection pattern 240. In an implementation, the wiring structure 220 may include a plurality of dielectric layers.

The second lower dielectric layer 230 may cover a bottom surface of the wiring structure 220. The second lower dielectric layer 230 may be a dielectric layer at bottom of the second structure 200. The second lower dielectric layer 230 may include a solder resist material. In an implementation, the second lower dielectric layer 230 may include a dielectric polymer material, e.g., epoxy or acryl.

The second lower connection patterns 240 may be conductive patterns that are exposed downwardly from the second structure 200. The second lower connection patterns 240 may be exposed through the second lower dielectric layer 230. The second lower dielectric layer 230 may partially cover a bottom surface of the second lower connection pattern 240. The second lower connection pattern 240 may include a conductive material.

The second lower connection pattern 240 may be surrounded by the wiring structure 220. In an implementation, the second lower connection pattern 240 may be surrounded by the second lower dielectric layer 230.

The second structure 200 may be a semiconductor chip including a semiconductor element. The semiconductor element may be between the substrate 210 and the wiring structure 220, and the semiconductor element and the second lower connection pattern 240 may be electrically connected through the conductive structure of the wiring structure 220. The semiconductor element may be, e.g., a logic element, a memory element, or an image sensor element. In an implementation, the second structure 200 may be a redistribution substrate or a printed circuit board.

The connection structure 300 may connect the upper connection pattern 150 of the first structure 100 to the second lower connection pattern 240 of the second structure 200. The connection structure 300 may include a lower conductor 310 connected to the upper connection pattern 150 of the first structure 100, an upper conductor 320 connected to the second lower connection pattern 240 of the second structure 200, and a dielectric pattern 330 that surrounds (e.g., at least a part of) the upper conductor 320.

The molding layer 410 may be on the first structure 100. The molding layer 410 may surround the second structure 200 and the connection structures 300. The molding layer 410 may include a polymeric material.

The terminal 420 may be connected to the first lower connection pattern 160 of the first structure 100. The semiconductor package may be electrically connected through the terminal 420 to an external apparatus. The terminal 420 may include a conductive material.

Referring to FIG. 1B, the lower conductor 310 may be connected to the upper conductor 320. The upper conductor 320 may include a lower portion 322 in contact (e.g., direct contact) with the lower conductor 310 and an upper portion 321 spaced apart from the lower conductor 310.

The upper conductor 320 and the lower conductor 310 may each include a conductive material. The lower portion 322 of the upper conductor 320 may include a metallic material that is the same as that of the lower conductor 310. The lower conductor 310 and the lower portion 322 of the upper conductor 320 may each include bismuth (Bi). The upper portion 321 of the upper conductor 320 may not include bismuth (Bi). Bismuth in the lower portion 322 of the upper conductor 320 may originate from bismuth in the lower conductor 310 (e.g., bismuth from the lower conductor 310 may diffuse into the lower portion 322 of the upper conductor 320).

The lower conductor 310 may further include, e.g., tin (Sn) or silver (Ag). The lower portion 322 of the upper conductor 320 may further include, e.g., silver (Ag), tin (Sn), or copper (Cu). The upper portion 321 of the upper conductor 320 may include, e.g., silver (Ag), tin (Sn), or copper (Cu).

The dielectric pattern 330 may include a first surface 331 in contact with the upper conductor 320, a second surface 332 in contact with the lower conductor 310, a third surface 333 in contact with the molding layer 410, and a fourth surface 334 in contact with a bottom surface 231 of the second lower dielectric layer 230 of the second structure 200. An entirety of the third surface 333 of the dielectric pattern 330 may be in contact with the molding layer 410.

In an implementation, an entirety of the second surface 332 of the dielectric pattern 330 may be in contact with the lower conductor 310. In an implementation, a portion of the second surface 332 of the dielectric pattern 330 may be in contact with the lower conductor 310.

The dielectric pattern 330 may be curved at the first surface 331 and the third surface 333. In an implementation, the first surface 331 and the third surface 333 of the dielectric pattern 330 may be curved when viewed in vertical or cross section, as shown in FIG. 1B. The first surface 331 of the dielectric pattern 330 may be curved, e.g., conforming to a surface of the upper conductor 320. The dielectric pattern 330 may be concave at the first surface 331. The dielectric pattern 330 may have a certain thickness, and the third surface 333 of the dielectric pattern 330 may be curved conforming to the first surface 331 of the dielectric pattern 330. The dielectric pattern 330 may be convex at the third surface 333. The dielectric pattern 330 may be flat at the second surface 332 and the fourth surface 334. In an implementation, the second surface 332 and the fourth surface 334 of the dielectric pattern 330 may be flat when viewed in vertical or cross section as shown in FIG. 1B.

The dielectric pattern 330 may have a certain thickness. In an implementation, the dielectric pattern 330 may have a thickness of equal to or greater than about 10 nm in the first direction D1. The dielectric pattern 330 may surround (e.g., at least a part of) the upper portion 321 of the upper conductor 320. The dielectric pattern 330 may include an oxide. In an implementation, the dielectric pattern 330 may include oxide including silver (Ag), tin (Sn), or copper (Cu).

The upper conductor 320 may penetrate the second lower dielectric layer 230 of the second structure 200 and may be coupled to the second lower connection pattern 240 of the second structure 200. The upper conductor 320 may be in contact with a sidewall and the bottom surface 231 of the second lower dielectric layer 230 of the second structure 200. The second lower dielectric layer 230 of the second structure 200 may surround a portion (e.g., remaining portion, not surrounded by the dielectric pattern 330) of the upper conductor 320.

The lower conductor 310 may penetrate (e.g., may extend into an opening in) the upper dielectric layer 120 of the first structure 100 and may be coupled to the upper connection pattern 150 of the first structure 100. The lower conductor 310 may be (e.g., laterally) spaced apart from the upper dielectric layer 120 of the first structure 100. The upper connection pattern 150 of the first structure 100 may be (e.g., laterally) spaced apart from the upper dielectric layer 120 of the first structure 100. A portion of the molding layer 410 may be between the lower conductor 310 and the upper dielectric layer 120 of the first structure 100 and between the upper dielectric layer 120 and the upper connection pattern 150 of the first structure 100. The upper dielectric layer 120 of the first structure 100 may surround a portion of the lower conductor 310.

The upper connection pattern 150 may include a sidewall 151 that is revealed or exposed outside or at a top of the first structure 100. The upper connection pattern 150 may have a portion at a higher level than that of the inner dielectric layer 110, and the sidewall 151 may be a sidewall of the portion of the upper connection pattern 150. The lower conductor 310 may cover an upper portion of the sidewall 151 of the upper connection pattern 150 of the first structure 100. The lower conductor 310 may expose (e.g., may not cover) a lower portion of the sidewall 151 of the upper connection pattern 150 of the first structure 100.

The molding layer 410 may cover the lower portion of the sidewall 151 of the upper connection pattern 150 of the first structure 100. The molding layer 410 may cover a sidewall of (e.g., the opening in) the upper dielectric layer 120 of the first structure 100, and may also cover a top surface of the inner dielectric layer 110 of the first structure 100.

The dielectric pattern 330 may have a height equal to or greater than about 0.3 times a distance between the top surface of an uppermost inner dielectric layer 110 of the first structure 100 and the bottom surface 231 of the second lower dielectric layer 230 of the second structure 200. In an implementation, a distance in the third direction D3 between the second surface 332 and the fourth surface 334 of the dielectric pattern 330 may be equal to or greater than about 0.3 times the distance between the top surface of the uppermost inner dielectric layer 110 of the first structure 100 and the bottom surface 231 of the second lower dielectric layer 230 of the second structure 200.

In an implementation, the connection structure 300 may include the dielectric pattern 330, and bismuth (Bi) may not diffuse toward or into the upper portion 321 of the upper conductor 320. The bismuth (Bi) may not diffuse toward or into the upper portion 321 of the upper conductor 320, the occurrence of a crack may be reduced or avoided between the upper portion 321 of the upper conductor 320 and the second lower connection pattern 240 of the second structure 200, and the semiconductor package may exhibit increased resistance to heat and external force.

In an implementation, the connection structure 300 may include the dielectric pattern 330, and the lower conductor 310 may cover (e.g., at least a part of) the sidewall 151 of the upper connection pattern 150. In an implementation, the occurrence of crack may be reduced avoided between the lower conductor 310 and a top surface of the upper connection pattern 150 of the first structure 100, and the semiconductor package may exhibit increased durability.

Figure 2A:
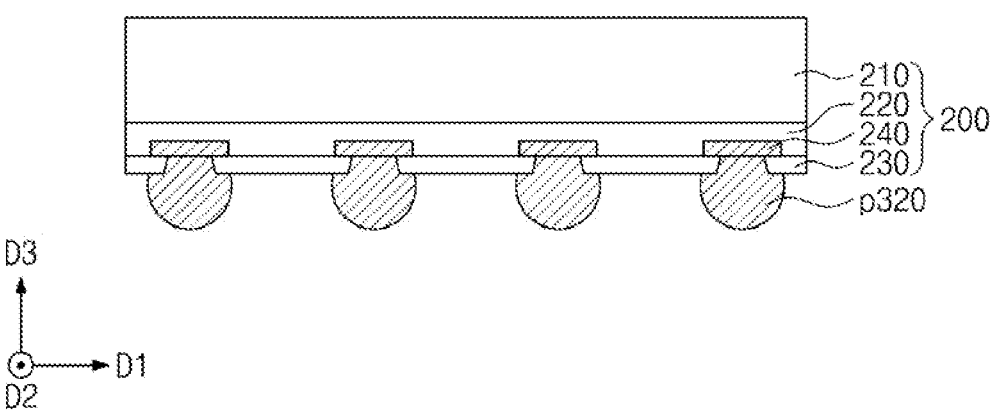
FIGS. 2A, 2B, 2C, and 2D illustrate cross-sectional views of stages in a method of fabricating a semiconductor package in accordance with FIGS. 1A and 2B.
Figure 2B:
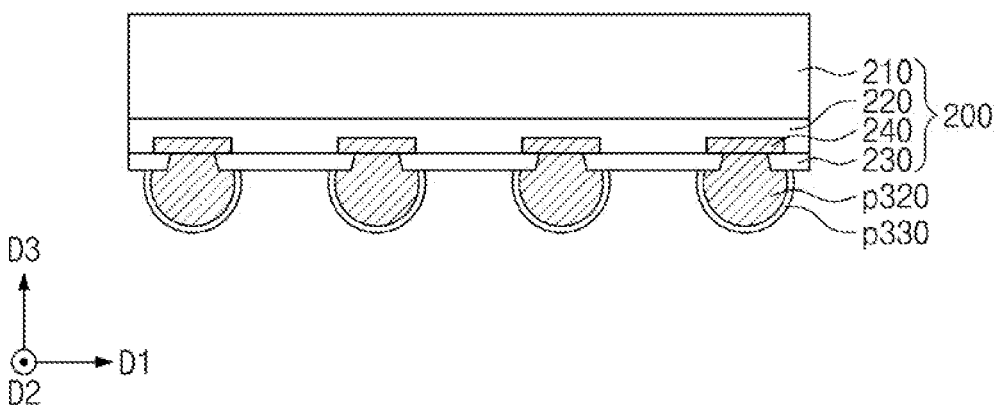

FIGS. 2A, 2B, 2C, and 2D illustrate cross-sectional views of stages in a method of fabricating a semiconductor package in accordance with FIGS. 1A and 2B.

Referring to FIG. 2A, a second structure 200 may be formed and may include a substrate 210, a wiring structure 220, second lower connection patterns 240, and a second lower dielectric layer 230.

Preliminary upper conductors p320 may be formed. The preliminary upper conductor p320 may be formed to be connected to the second lower connection pattern 240 of the second structure 200. The preliminary upper conductor p320 may include a conductive material. In an implementation, the preliminary upper conductor p320 may include, e.g., silver (Ag), tin (Sn), or copper (Cu).

Referring to FIG. 2B, preliminary dielectric layers p330 may be formed. The preliminary dielectric layer p330 may be formed on the preliminary upper conductor p320. The preliminary dielectric layer p330 may cover a (e.g., exposed) surface of the preliminary upper conductor p320. The preliminary dielectric layer p330 may include an oxide. In an implementation, the formation of the preliminary dielectric layer p330 may include naturally oxidizing the preliminary upper conductor p320. In an implementation, the formation of the preliminary dielectric layer p330 may include putting the second structure 200 with the preliminary upper conductors p320 in a chamber and supplying the chamber with oxygen gas.

Figure 2C:
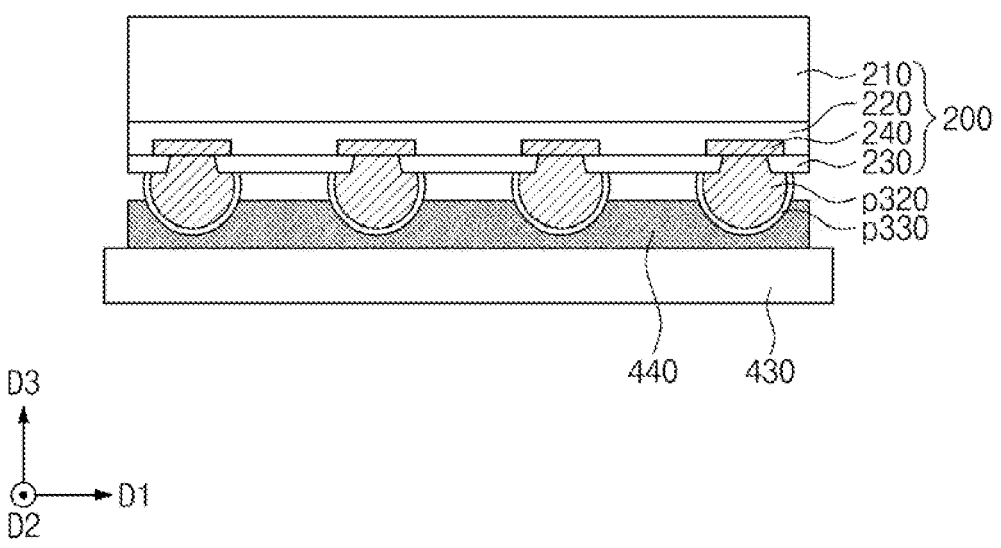

Referring to FIG. 2C, a tray 430 may be provided and a remover 440 may be provided on the tray 430. The remover 440 may include a material that is able to remove oxide in contact therewith. In an implementation, the remover 440 may be a solvent capable of dissolving oxide.

The remover 440 may be provided thereon or brought into contact with the preliminary dielectric layer p330, the preliminary upper conductors p320, and the second structure 200. A lower portion of the preliminary dielectric layer p330 may be in contact with the remover 440.

Figure 2D:
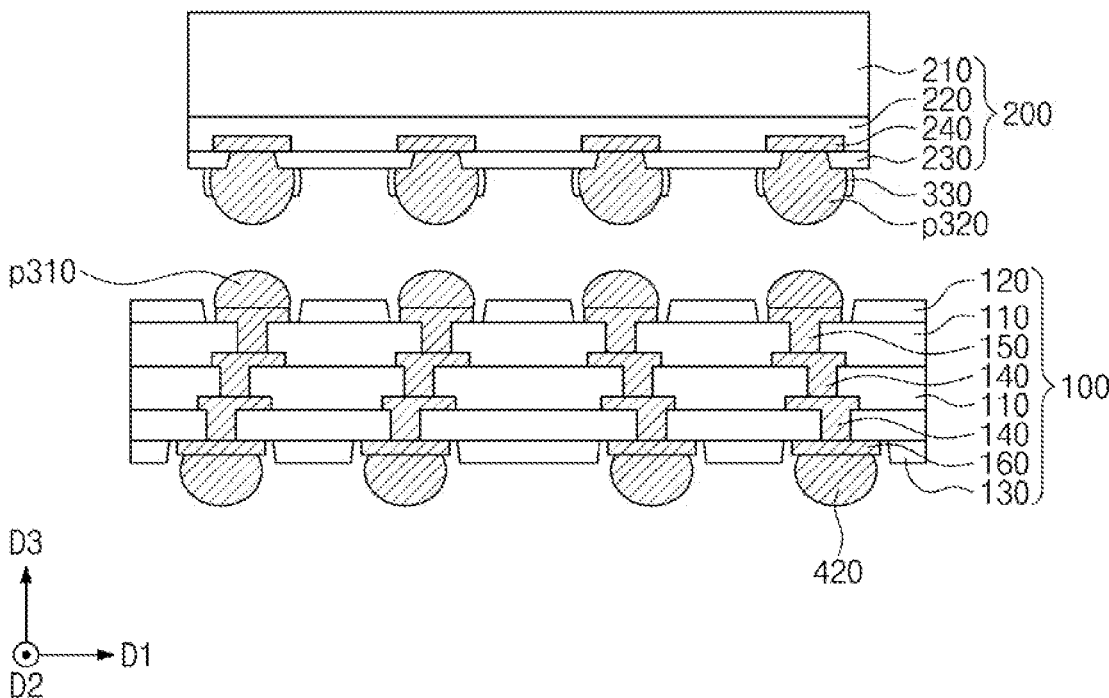

Referring to FIG. 2D, the remover 440 and the preliminary dielectric layer p330 may react with each other to remove a lower portion of the preliminary dielectric layer p330 in contact with the remover 440. A dielectric pattern 330 may be defined to refer to remaining portions of the preliminary dielectric layer p330, whose lower portion has been removed. The lower portion of the preliminary dielectric layer p330 may be removed to expose a lower portion of the preliminary upper conductor p320.

A first structure 100 may be formed and may include inner dielectric layers 110, an upper dielectric layer 120, a first lower dielectric layer 130, inner patterns 140, upper connection patterns 150, and first lower connection patterns 160. Terminals 420 may be formed. The terminal 420 may be connected to the first lower connection pattern 160 of the first structure 100. In an implementation, the terminal 420 may be formed after forming a connection structure (see 300 of FIG. 1A) or a molding layer (see 410 of FIG. 1A).

Preliminary lower conductors p310 may be formed. The preliminary lower conductor p310 may be formed to be connected to the upper connection pattern 150 of the first structure 100. The preliminary lower conductor p310 may include a conductive material. In an implementation, the preliminary lower conductor p310 may include bismuth (Bi), and may also include, e.g., tin (Sn) or silver (Ag).

Referring to FIGS. 1A and 1B, the preliminary lower conductor p310 and the preliminary upper conductor p320 may be connected to each other. In an implementation, the preliminary lower conductor p310 and the preliminary upper conductor p320 may be connected through a surface mount technology (SMT) process.

The connection between the preliminary lower conductor p310 and the preliminary upper conductor p320 may include providing the preliminary upper conductor p320 on the preliminary lower conductor p310, and heating the preliminary lower conductor p310 and the preliminary upper conductor p320. The preliminary lower conductor p310 and the preliminary upper conductor p320 may be heated at a relatively low temperature. In an implementation, the preliminary lower conductor p310 and the preliminary upper conductor p320 may be heated at a temperature ranging from about 180° C. to about 200° C.

The preliminary lower conductor p310 and its connected preliminary upper conductor p320 may form a lower conductor 310 and an upper conductor 320. In an implementation, the preliminary lower conductor p310 and its connected preliminary upper conductor p320 may be connected to each other, and bismuth (Bi) in the preliminary lower conductor p310 may diffuse toward or into the preliminary upper conductor p320, and a lower portion 322 of the upper conductor 320 may include bismuth (Bi). A molding layer 410 may be formed on the first structure 100.

In an implementation, the dielectric pattern 330 may be formed before the preliminary upper conductor p320 and the preliminary lower conductor p310 are connected to each other, and a relatively small contact area may be made between the preliminary lower conductor p310 and the preliminary upper conductor p320 in a process where the preliminary upper conductor p320 and the preliminary lower conductor p310 are connected to each other. In an implementation, bismuth (Bi) included in the preliminary lower conductor p310 may not diffuse to an upper portion of the preliminary upper conductor p320, and the upper portion 321 of the upper conductor 320 may not include bismuth (Bi).

In an implementation, the dielectric pattern 330 may be formed before the preliminary upper conductor p320 and the preliminary lower conductor p310 are connected to each other, and the preliminary lower conductor p310 may cover a sidewall 151 of the upper connection pattern 150 of the first structure 100 in a process where the preliminary upper conductor p320 and the preliminary lower conductor p310 are connected to each other.

Figure 3:
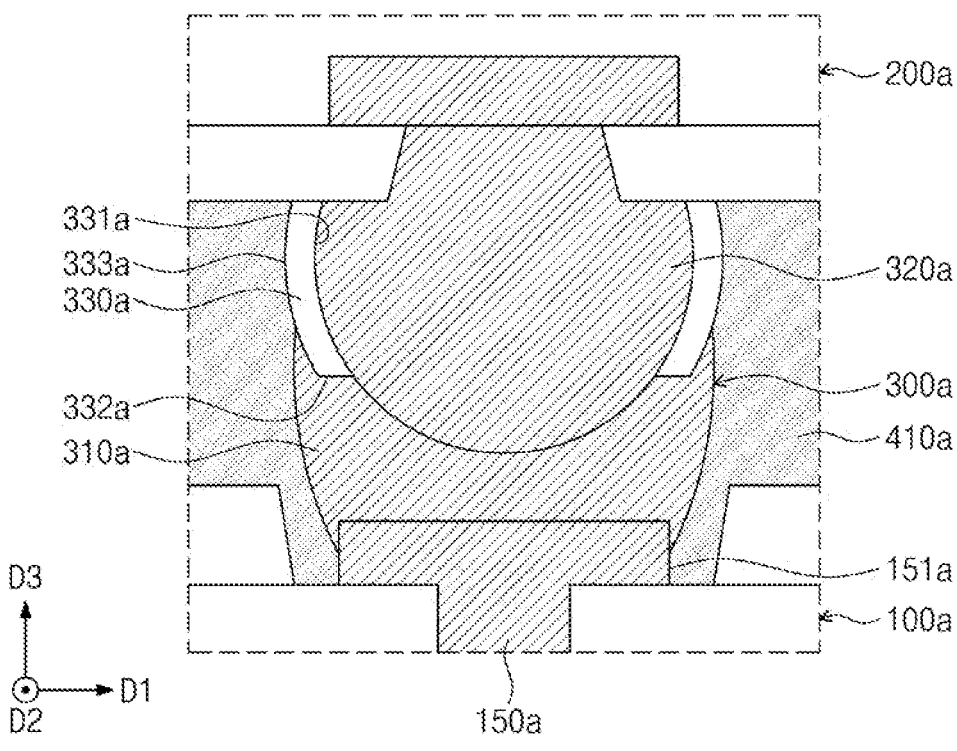
FIG. 3 illustrates an enlarged cross-sectional view showing a semiconductor package according to some embodiments.

FIG. 3 illustrates an enlarged cross-sectional view showing a semiconductor package according to some embodiments.

Referring to FIG. 3, a semiconductor package may include a first structure 100a, a second structure 200a, a connection structure 300a that connects the first structure 100a to the second structure 200a, and a molding layer 410a.

The connection structure 300a may include a lower conductor 310a connected to the first structure 100a, an upper conductor 320a connected to the second structure 200a, and a dielectric pattern 330a.

The dielectric pattern 330a may include a first surface 331a in contact with the upper conductor 320a, a second surface 332a in contact with the lower conductor 310a, and a third surface 333a in contact with the molding layer 410a and the lower conductor 310a.

An entirety of the second surface 332a of the dielectric pattern 330a may be in contact with the lower conductor 310a. A portion of the third surface 333a of the dielectric pattern 330a may be in contact with the lower conductor 310*a*, and another portion of the third surface 333*a* of the dielectric pattern 330*a* may be in contact with the molding layer 410*a*.

The dielectric pattern 330*a* may be curved at the first surface 331*a* and the third surface 333*a*. The dielectric pattern 330*a* may be flat at the second surface 332*a*.

Figure 4:
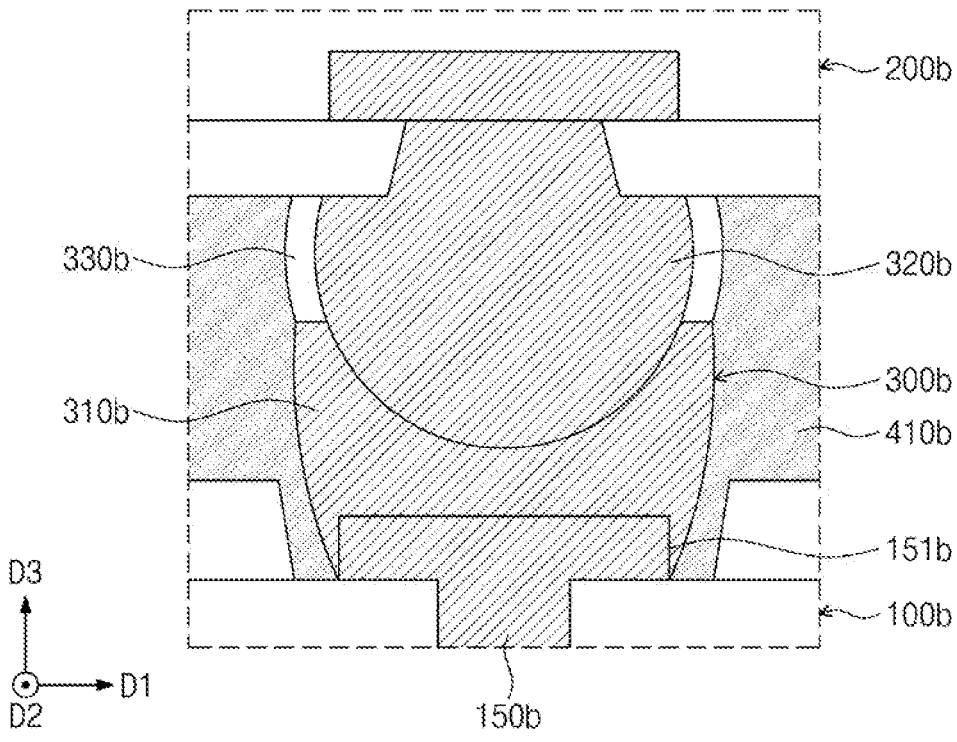
FIG. 4 illustrates an enlarged cross-sectional view showing a semiconductor package according to some embodiments.

FIG. 4 illustrates an enlarged cross-sectional view showing a semiconductor package according to some embodiments.

Referring to FIG. 4, a semiconductor package may include a first structure 100*b*, a second structure 200*b*, a connection structure 300*b* that connects the first structure 100*b* to the second structure 200*b*, and a molding layer 410*b*.

The connection structure 300*b* may include a lower conductor 310*b* connected to the first structure 100*b*, an upper conductor 320*b* connected to the second structure 200*b*, and a dielectric pattern 330*b*.

The first structure 100*b* may include an upper connection pattern 150*b* connected to the lower conductor 310*b*. The upper connection pattern 150*b* may include a sidewall 151*b* that is revealed outside or at a top of the first structure 100*b*. An entirety of the sidewall 151*b* of the upper connection pattern 150*b* may be in contact with (e.g., covered by) the lower conductor 310*b*.

Figure 5:
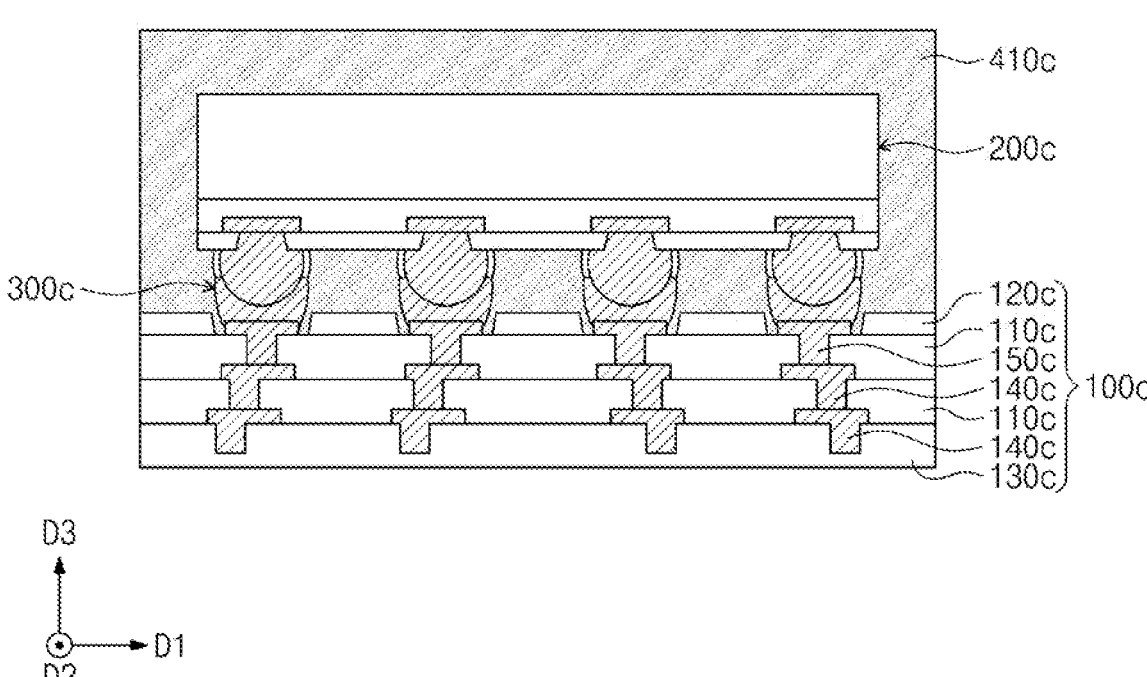
FIG. 5 illustrates a cross-sectional view showing a semiconductor package according to some embodiments.

FIG. 5 illustrates a cross-sectional view showing a semiconductor package according to some embodiments.

Referring to FIG. 5, a semiconductor package may include a first structure 100*c* including inner dielectric layers 110*c*, an upper dielectric layer 120*c*, a lower dielectric layer 130*c*, inner patterns 140*c*, and upper connection patterns 150*c*, and may also include a second structure 200*c*, connection structures 300*c*, and a molding layer 410*c*.

The lower dielectric layer 130*c* of the first structure 100*c* may have a bottom surface that is flat with no opening. The first structure 100*c* may not include a conductive pattern that penetrates the bottom surface of the lower dielectric layer 130*c*. The first structure 100*c* may not include lower connection patterns that are exposed downwardly from the first structure 100*c*.

Figure 6:
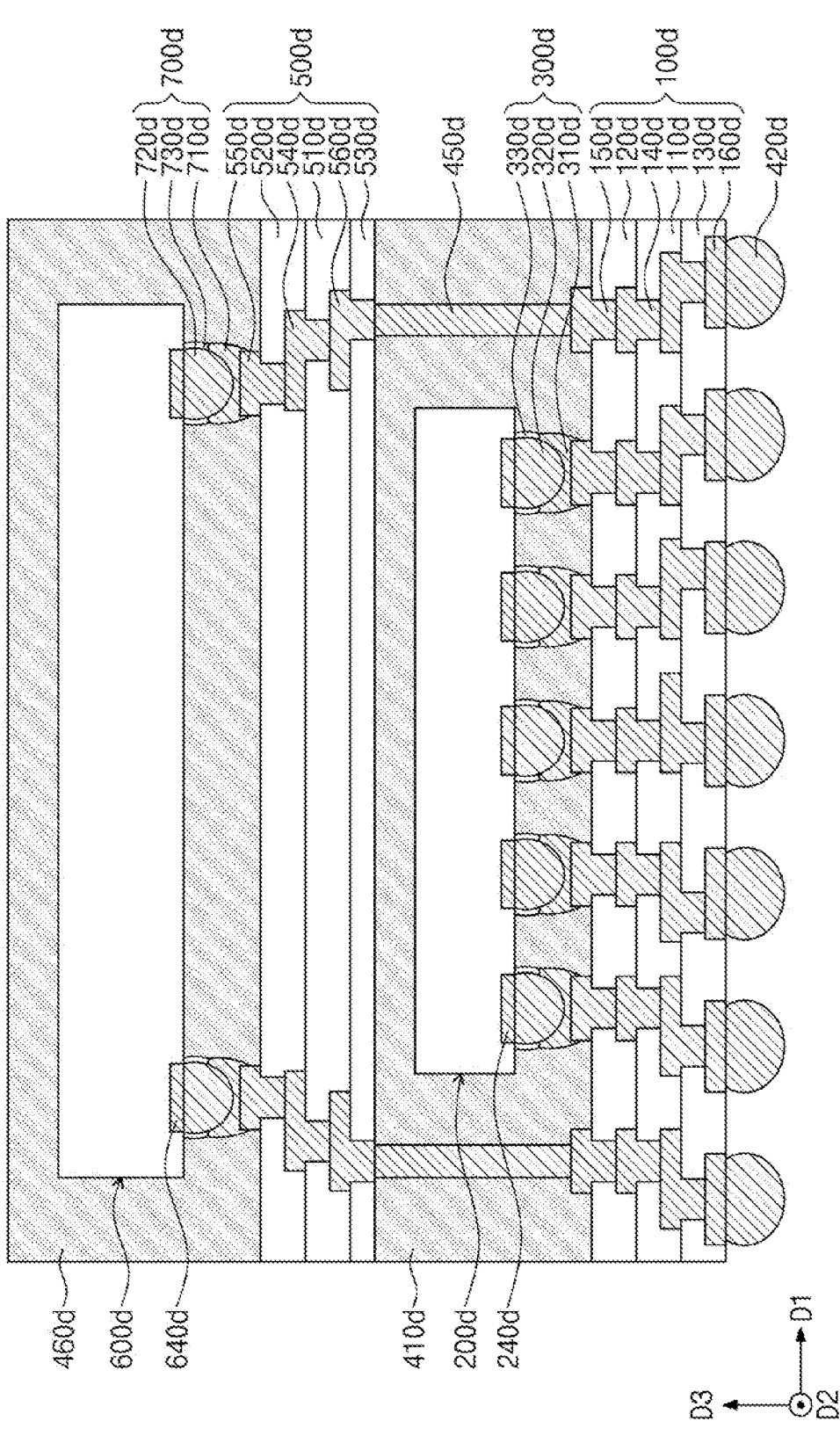
FIG. 6 illustrates a cross-sectional view showing a semiconductor package according to some embodiments.

FIG. 6 illustrates a cross-sectional view showing a semiconductor package according to some embodiments.

Referring to FIG. 6, a semiconductor package may include a first structure 100*d*, a second structure 200*d*, a third structure 500*d*, a fourth structure 600*d*, first connection structures 300*d*, second connection structures 700*d*, a first molding layer 410*d*, a second molding layer 460*d*, terminals 420*d*, and connection vias 450*d*.

The first structure 100*d* may include a first inner dielectric layer 110*d*, a first upper dielectric layer 120*d*, a first lower dielectric layer 130*d*, first inner patterns 140*d*, first upper connection patterns 150*d*, and first lower connection patterns 160*d*. The terminal 420*d* may be connected to the first lower connection pattern 160*d* of the first structure 100*d*. The first structure 100*d* may be a redistribution substrate.

The second structure 200*d* may be on the first structure 100*d*. The second structure 200*d* may include a second lower connection pattern 240*d*. The second structure 200*d* may be a semiconductor chip.

The first connection structures 300*d* may connect the first structure 100*d* to the second structure 200*d*. The first connection structure 300*d* may include a first lower conductor 310*d* connected to the first upper connection pattern 150*d* of the first structure 100*d*, a first upper conductor 320*d* connected to the second lower connection pattern 240*d* of the second structure 200*d*, and a first dielectric pattern 330*d*.

The first molding layer 410*d* may surround the second structure 200*d* and the first connection structures 300*d*. The connection via 450*d* may penetrate the first molding layer 410*d* to be connected to the first upper connection pattern 150*d* of the first structure 100*d*.

The third structure 500*d* may be on the first molding layer 410*d*. The third structure 500*d* may include a second inner dielectric layer 510*d*, a second upper dielectric layer 520*d*, a second lower dielectric layer 530*d*, second inner patterns 540*d*, second upper connection patterns 550*d*, and third lower connection patterns 560*d*. The connection via 450*d* may be connected to the third lower connection pattern 560*d* of the third structure 500*d*. The third structure 500*d* may be a redistribution substrate.

The fourth structure 600*d* may be on the third structure 500*d*. The fourth structure 600*d* may include a fourth lower connection pattern 640*d*. The fourth structure 600*d* may be a semiconductor chip.

The second connection structures 700*d* may connect the third structure 500*d* to the fourth structure 600*d*. The second connection structure 700*d* may include a second lower conductor 710*d* connected to the second upper connection pattern 550*d* of the third structure 500*d*, a second upper conductor 720*d* connected to the fourth lower connection pattern 640*d* of the fourth structure 600*d*, and a second dielectric pattern 730*d*.

The second molding layer 460*d* may surround the fourth structure 600*d* and the second connection structures 700*d*.

Figure 7:
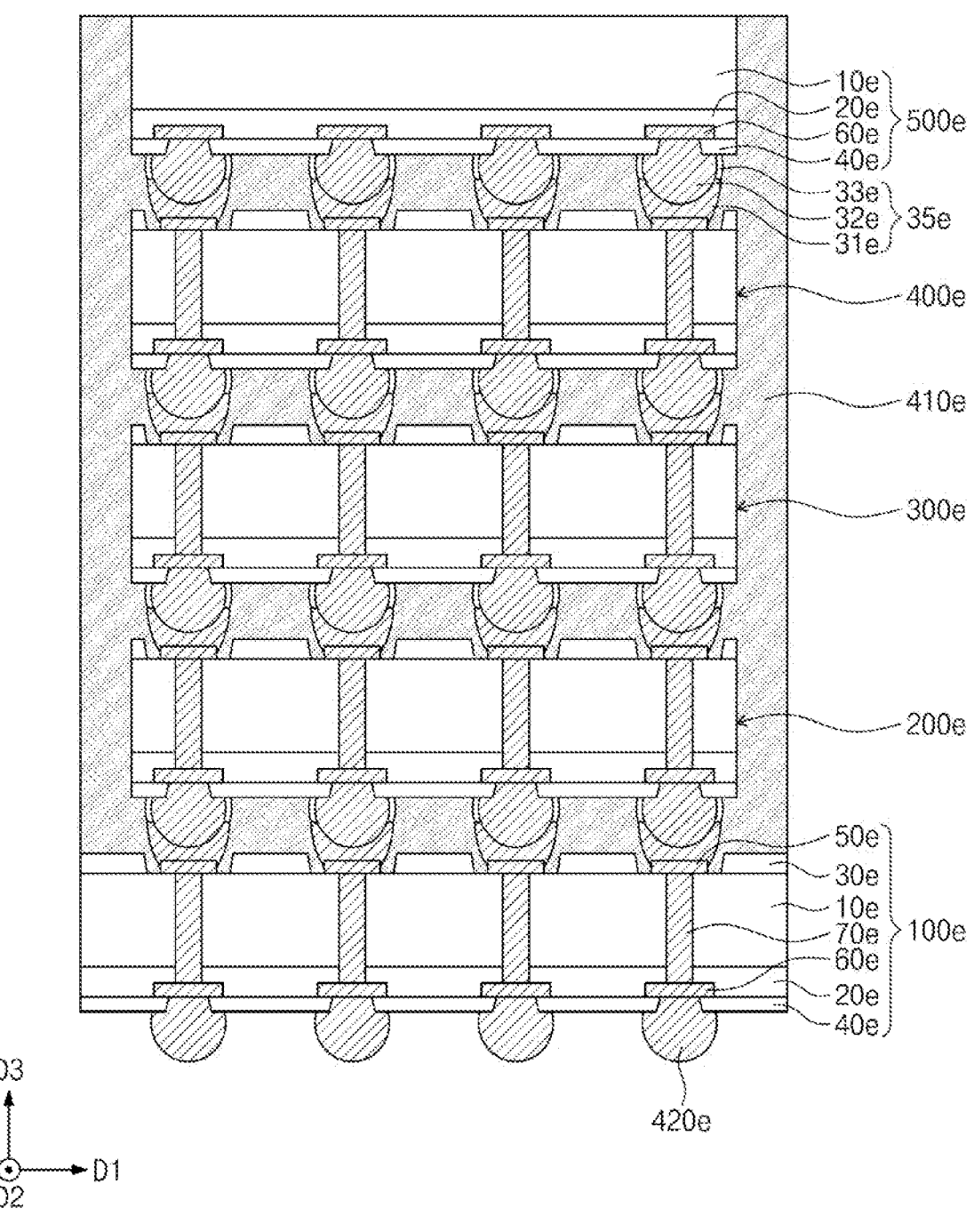
FIG. 7 illustrates a cross-sectional view showing a semiconductor package according to some embodiments.

FIG. 7 illustrates a cross-sectional view showing a semiconductor package according to some embodiments.

Referring to FIG. 7, a semiconductor package may include a first structure 100*e*, a second structure 200*e*, a third structure 300*e*, a fourth structure 400*e*, and a fifth structure 500*e* that are sequentially provided along the third direction D3. Each of the first, second, third, and fourth structures 100*e*, 200*e*, 300*e*, and 400*e* may include a substrate 10*e*, a wiring structure 20*e*, an upper dielectric layer 30*e*, a lower dielectric layer 40*e*, upper connection patterns 50*e*, lower connection patterns 60*e*, and through vias 70*e*. The through via 70*e* may be connected to the upper connection pattern 50*e* and the lower connection pattern 60*e*. The through vias 70*e* may include a conductive material.

The fifth structure 500*e* may include the substrate 10*e*, the wiring structure 20*e*, the lower dielectric layer 40*e*, and the lower connection patterns 60*e*.

Each of the first, second, third, fourth, and fifth structures 100*e*, 200*e*, 300*e*, 400*e*, and 500*e* may be a semiconductor chip including a logic element or a memory element. In an implementation, the first structure 100*e* may be a redistribution substrate or a printed circuit board.

Connection structures 35*e* may be between the first and second structures 100*e* and 200*e*, between the second and third structures 200*e* and 300*e*, between the third and fourth structures 300*e* and 400*e*, and between the fourth and fifth structures 400*e* and 500*e*. The connection structure 35*e* may include a lower conductor 31*e*, an upper conductor 32*e*, and a dielectric pattern 33*e*.

The semiconductor package may further include a terminal 420*e* connected to the lower connection pattern 60*e* of the first structure 100*e*. The semiconductor package may further include a molding layer 410*e* that surrounds the second, third, fourth, and fifth structures 200*e*, 300*e*, 400*e*, and 500*e* and the connection structures 35*e*.

Figure 8:
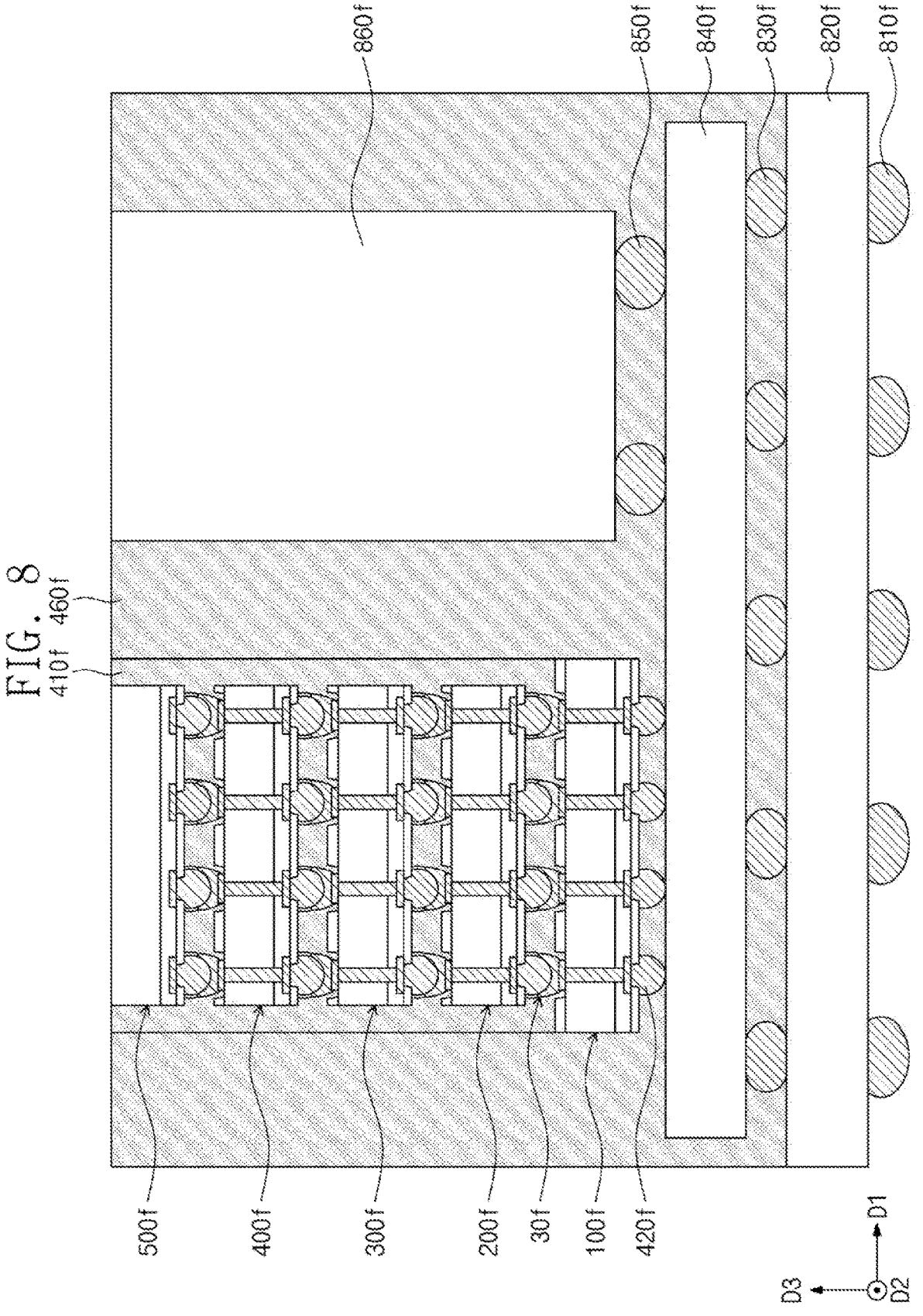
FIG. 8 illustrates a cross-sectional view showing a semiconductor package according to some embodiments.

FIG. 8 illustrates a cross-sectional view showing a semiconductor package according to some embodiments.

Referring to FIG. 8, a semiconductor package may include a package substrate 820*f*. For example, the package substrate 820*f* may be a printed circuit board. First terminals 810*f* may be electrically connected to the package substrate

820f The semiconductor package may be mounted through the first terminals 810f on an external apparatus (e.g., mainboard).

An interposer 840f may be on the package substrate 820f Second terminals 830f may electrically connect the package substrate 820f to the interposer 840f The second terminals 830f may be between the package substrate 820f and the interposer 840f.

A processor chip 860f may be on the interposer 840f. In an implementation, the processor chip 860f may be a graphic processing unit (GPU) or a central processing unit (CPU). Third terminals 850f may electrically connect the processor chip 860f to the interposer 840f. The third terminals 850f may be between the processor chip 860f and the interposer 840f.

The interposer 840f may be provided thereon with first, second, third, fourth, and fifth structures 100f, 200f, 300f, 400f, and 500f that are sequentially stacked along the third direction D3. The first, second, third, fourth, and fifth structures 100f, 200f, 300f, 400f, and 500f may each be a semiconductor chip including a logic element or a memory element. Connection structures 30f may be between the first, second, third, fourth, and fifth structures 100f, 200f, 300f, 400f, and 500f. The first to fifth structures 100f to 500f and the connection structures 30f may be analogous to the first to fifth structures 100e to 500e and the connection structures 35e of FIG. 7.

Fourth terminals 420f may electrically connect the first structure 100f to the interposer 840f. The fourth terminals 420f may be between the first structure 100f and the interposer 840f A first molding layer 410f may surround the second, third, fourth, and fifth structures 200f, 300f, 400f, and 500f. A second molding layer 460f may surround the interposer 840f, the processor chip 860f, and the first, second, third, fourth, and fifth structures 100f, 200f, 300f, 400f, and 500f.

In an implementation, similar to the connection structure 30f, each of the second, third, and fourth terminals 830f, 850f, and 420f may include a lower conductor, an upper conductor, and a dielectric pattern.

One or more embodiments may provide a semiconductor package including a connection structure.

One or more embodiments may provide a semiconductor package improved electrical properties and increased reliability.

A semiconductor package according to some embodiments may include a connection structure to prevent the occurrence of crack and to help increase durability thereof.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
a first structure that includes an upper connection pattern;
a second structure that includes a lower connection pattern;

a connection structure that connects the upper connection pattern of the first structure to the lower connection pattern of the second structure; and
a molding layer that surrounds the connection structure,
wherein:
the connection structure includes:
a lower conductor connected to the upper connection pattern of the first structure;
an upper conductor connected to the lower conductor and the lower connection pattern of the second structure; and
a dielectric pattern that at least partially surrounds the upper conductor, and
the dielectric pattern includes:
a first surface in contact with the upper conductor;
a second surface in contact with the lower conductor; and
a third surface having a first portion in contact with the molding layer and a second portion in contact with the lower conductor.

2. The semiconductor package as claimed in claim 1, wherein:
the upper conductor includes:
a lower portion in contact with the lower conductor; and
an upper portion spaced apart from the lower conductor, and
the lower conductor and the lower portion of the upper conductor include a same metallic material.

3. The semiconductor package as claimed in claim 2, wherein the lower conductor and the lower portion of the upper conductor each include bismuth.

4. The semiconductor package as claimed in claim 2, wherein the upper portion of the upper conductor does not include bismuth.

5. The semiconductor package as claimed in claim 1, wherein the first surface of the dielectric pattern is curved.

6. The semiconductor package as claimed in claim 5, wherein the first surface conforms to a surface of the upper conductor.

7. The semiconductor package as claimed in claim 5, wherein the third surface is curved and conforms to the first surface.

8. The semiconductor package as claimed in claim 1, wherein the second surface of the dielectric pattern is flat.

9. The semiconductor package as claimed in claim 1, wherein a thickness of the dielectric pattern is equal to or greater than about 10 nm.

10. A semiconductor package, comprising:
a connection structure including a lower conductor, an upper conductor connected to the lower conductor, and a dielectric pattern that at least partially surrounds the upper conductor;
a first structure including an upper connection pattern connected to the lower conductor and an upper dielectric layer that surrounds the lower conductor; and
a second structure including a lower connection pattern connected to the upper conductor and a lower dielectric layer that surrounds the upper conductor,
wherein the dielectric pattern is in contact with a bottom surface of the lower dielectric layer of the second structure, and
wherein the upper dielectric layer of the first structure is spaced apart from the lower connection pattern and the lower conductor.

11. The semiconductor package as claimed in claim 10, wherein:

the upper connection pattern of the first structure includes a sidewall exposed at an outside of the first structure, and the lower conductor covers at least a part of the sidewall.

12. The semiconductor package as claimed in claim 11, wherein the lower conductor covers an upper portion of the sidewall.

13. The semiconductor package as claimed in claim 11, wherein the lower conductor covers an entirety of the sidewall.

14. The semiconductor package as claimed in claim 10, further comprising a molding layer that surrounds the connection structure, wherein the dielectric pattern includes:

a first surface in contact with the upper conductor;

a second surface in contact with the lower conductor; and a third surface in contact with the molding layer.

15. The semiconductor package as claimed in claim 14, wherein the first surface and the third surface of the dielectric pattern are curved.

16. The semiconductor package as claimed in claim 15, wherein the second surface of the dielectric pattern is flat.

17. A semiconductor package, comprising:

a first structure including an upper connection pattern and an upper dielectric layer;

a second structure including a lower connection pattern and a lower dielectric layer that faces the upper dielectric layer of the first structure;

a connection structure that connects the upper connection pattern of the first structure to the lower connection pattern of the second structure; and a molding layer that surrounds the connection structure and the second structure, wherein:

the connection structure includes:

a lower conductor connected to the upper connection pattern of the first structure;

an upper conductor connected to the lower conductor and the lower connection pattern of the second structure; and a dielectric pattern that at least partially surrounds the upper conductor and contacts a bottom surface of the lower dielectric layer, the dielectric pattern includes:

a first surface in contact with the upper conductor;

a second surface in contact with the lower conductor; and a third surface in contact with the molding layer, the first surface and the third surface of the dielectric pattern are curved, and the second surface is a lowermost surface of the dielectric pattern.

18. The semiconductor package as claimed in claim 17, wherein:

the upper conductor includes:

a lower portion in contact with the lower conductor; and an upper portion spaced apart from the lower conductor, and the lower portion of the upper conductor includes bismuth.

19. The semiconductor package as claimed in claim 18, wherein the upper portion of the upper conductor does not include bismuth.

20. The semiconductor package as claimed in claim 17, wherein the second surface is a flat surface in contact with a surface of the lower conductor facing the second structure.

* * * * *